United States Patent
Cheng

(10) Patent No.: US 10,527,671 B2
(45) Date of Patent: Jan. 7, 2020

(54) ABSORPTION TESTING APPARATUS

(71) Applicant: CHROMA ATE INC., Taoyuan (TW)

(72) Inventor: Po-Kai Cheng, Taoyuan (TW)

(73) Assignee: CHROMA ATE INC., Taoyuan (TW)

( * ) Notice: Subject to any disclaimer, the term of this patent is extended or adjusted under 35 U.S.C. 154(b) by 187 days.

(21) Appl. No.: 15/846,031

(22) Filed: Dec. 18, 2017

(65) Prior Publication Data

US 2018/0172762 A1 Jun. 21, 2018

(51) Int. Cl.
   *G01R 31/28* (2006.01)
   *G01R 1/067* (2006.01)

(52) U.S. Cl.
   CPC ..... *G01R 31/2891* (2013.01); *G01R 1/06716* (2013.01); *G01R 31/2863* (2013.01)

(58) Field of Classification Search
   None
   See application file for complete search history.

(56) References Cited

U.S. PATENT DOCUMENTS

| | | | | |
|---|---|---|---|---|
| 8,353,730 | B1 * | 1/2013 | Wang | H01R 13/2421 439/515 |
| 2002/0190740 | A1 * | 12/2002 | Ishizaka | G01R 31/2863 324/750.05 |
| 2007/0035310 | A1 * | 2/2007 | Muller | F15B 15/2869 324/635 |
| 2010/0026331 | A1 * | 2/2010 | Chong | G01R 1/07342 324/754.03 |
| 2018/0261940 | A1 * | 9/2018 | Sherman | H01R 12/7005 |

FOREIGN PATENT DOCUMENTS

TW 201447329 A * 12/2014

* cited by examiner

*Primary Examiner* — Jermele M Hollington
(74) *Attorney, Agent, or Firm* — Maschoff Brennan

(57) ABSTRACT

An absorption testing apparatus supports a carrier board and includes a supporting platform, an electrically conductive component, a sealing ring and an electrical probe. The supporting platform has opposite top and bottom surfaces and a pathway penetrating through the top and bottom surfaces. The electrically conductive component, having a plate and elastic arms, is located in the pathway and is embedded in the supporting platform to divide the pathway into absorption and accommodating areas that are isolated by the plate. The elastic arms penetrate through the plate. The sealing ring, on the top surface, surrounds the absorption area and supports the carrier board. Each elastic arm has one end in the absorption area, electrically connecting to the carrier board. The electrical probe is located in the pathway and includes a body and probe heads. Each elastic arm has another end in the accommodating area, electrically connecting to the probe heads.

6 Claims, 4 Drawing Sheets

ABSORPTION TESTING APPARATUS

CROSS-REFERENCE TO RELATED APPLICATIONS

This non-provisional application claims priority under 35 U. S. C. § 119(a) on Patent Application No(s). 105143739 filed in Taiwan on Dec. 28, 2016, the entire contents of which are hereby incorporated by reference.

TECHNICAL FIELD

The disclosure relates to a testing apparatus, more particularly to an absorption testing apparatus.

BACKGROUND

With the progress of technology, semiconductor components have an enhanced performance, and are able to perform diverse functions. To ensure the semiconductor components are functional and will work, they are tested before shipment.

In one of the testing processes, the semiconductor components are disposed on a supporting platform, which is disposed with many circuit boards for testing and many pogo pins. A carrier board on the supporting platform is used to electrically connect to the semiconductor components. Before testing the semiconductor components, the carrier board should be mounted on the supporting platform so that the circuit boards and the semiconductor components can be electrically connected to each other through the carrier board. Generally, the carrier board is fixed to the supporting platform through a vacuum absorption manner to ensure the electrical connection between the carrier board and the pogo pins.

SUMMARY

One embodiment of the disclosure provides an absorption testing apparatus adaptive to support a carrier board. The absorption testing apparatus includes a supporting platform, an electrically conductive component, a first sealing ring and an electrical probe. The supporting platform has a top surface, a bottom surface and a pathway. The bottom surface faces away from the top surface. The pathway penetrates through the top surface and the bottom surface. The electrically conductive component includes a plate and a plurality of elastic arms. The plate is located in the pathway and is embedded in the supporting platform to divide the pathway into an absorption area and an accommodating area. The elastic arms penetrate the plate. The first sealing ring is disposed on the top surface, and surrounds the absorption area. The first sealing ring is for disposing the carrier board. Each of the electrically conductive components has one end located in the absorption area in order to electrically connect to the carrier board. The electrical probe is located in the pathway. The electrical probe includes a body and a plurality of probe heads. The body is fixed to the supporting platform. Each of the elastic arms has another end located in the accommodating area in order to electrically connect the probe heads.

BRIEF DESCRIPTION OF THE DRAWINGS

The present disclosure will become more fully understood from the detailed description given here in below and the accompanying drawings which are given by way of illustration only and thus are not intending to limit the present disclosure and wherein.

DETAILED DESCRIPTION

Figure 1:
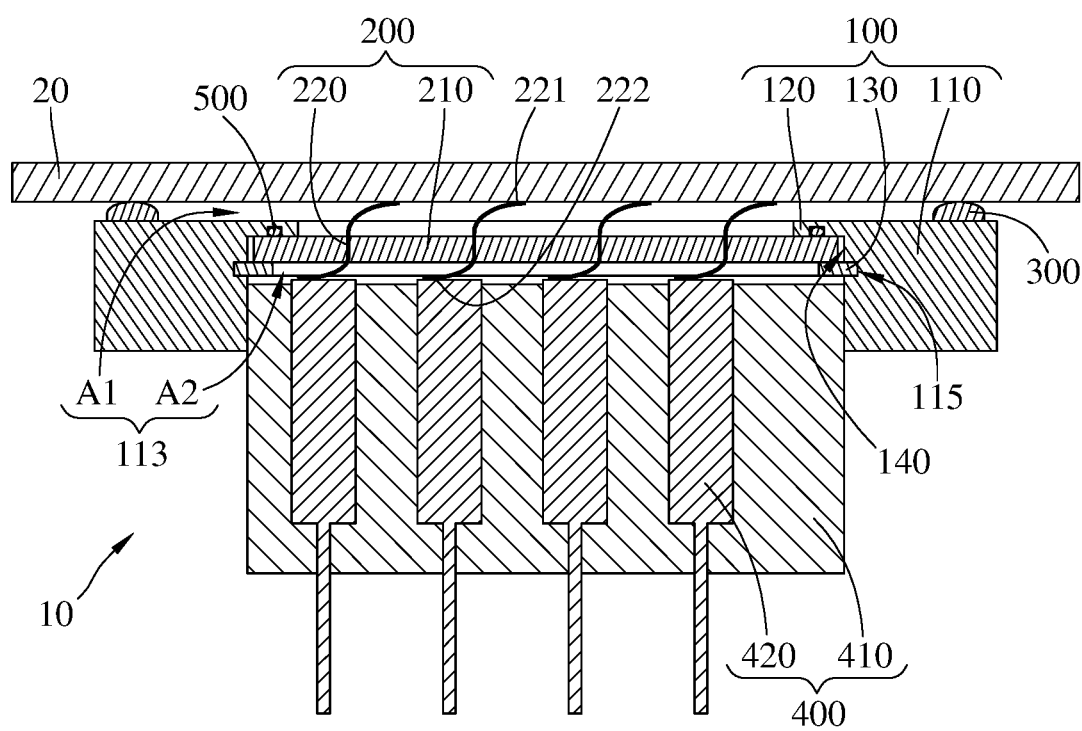
FIG. 1 is a cross-sectional view of an absorption testing apparatus in accordance with one embodiment of the disclosure.

In the following detailed description, for purposes of explanation, numerous specific details are set forth in order to provide a thorough understanding of the disclosed embodiments. It will be apparent, however, that one or more embodiments may be practiced without these specific details. In other instances, well-known structures and devices are schematically shown in order to simplify the drawing.

Figure 2:
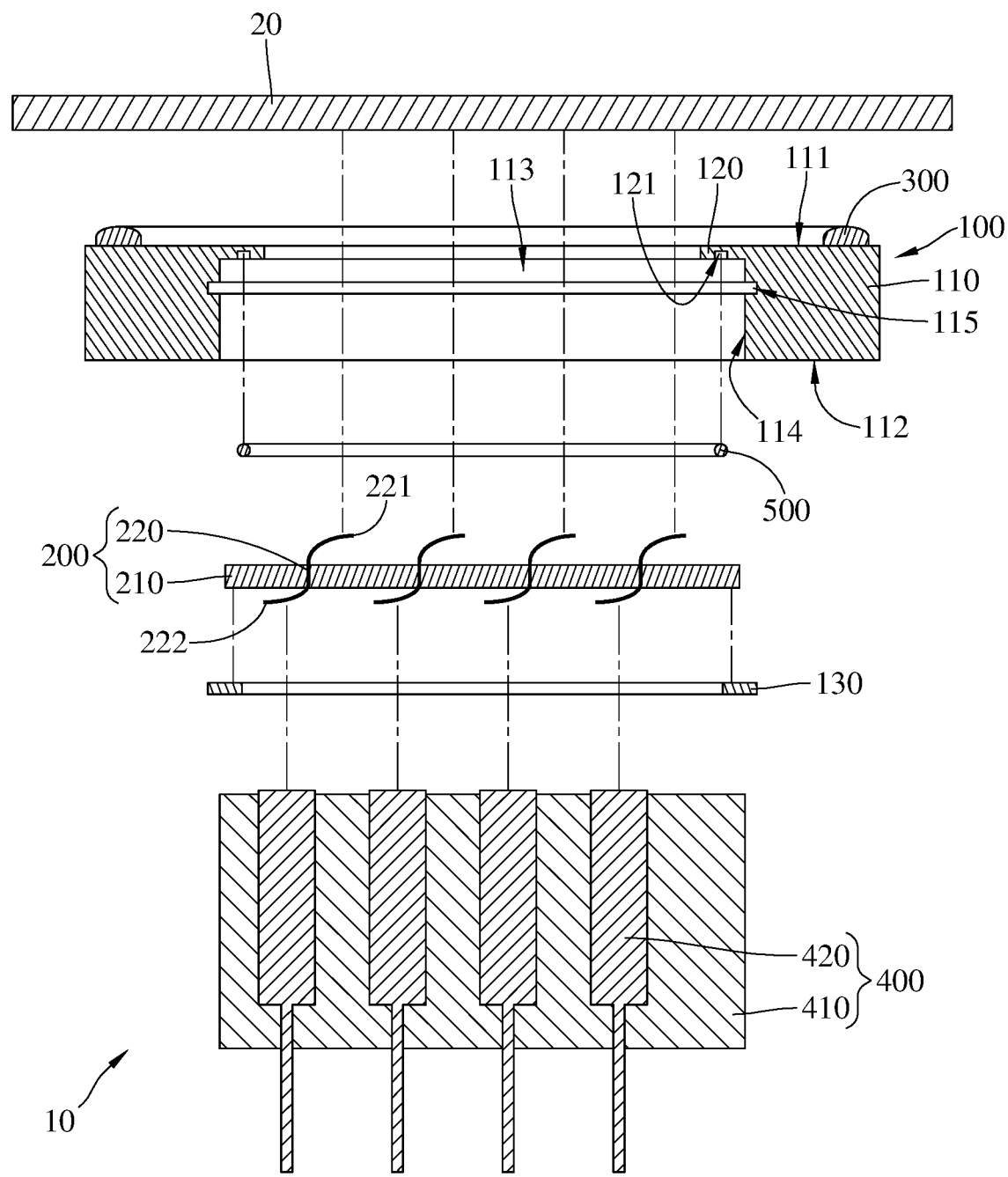
FIG. 2 is an exploded view of the absorption testing apparatus in FIG. 1.
Figure 3:
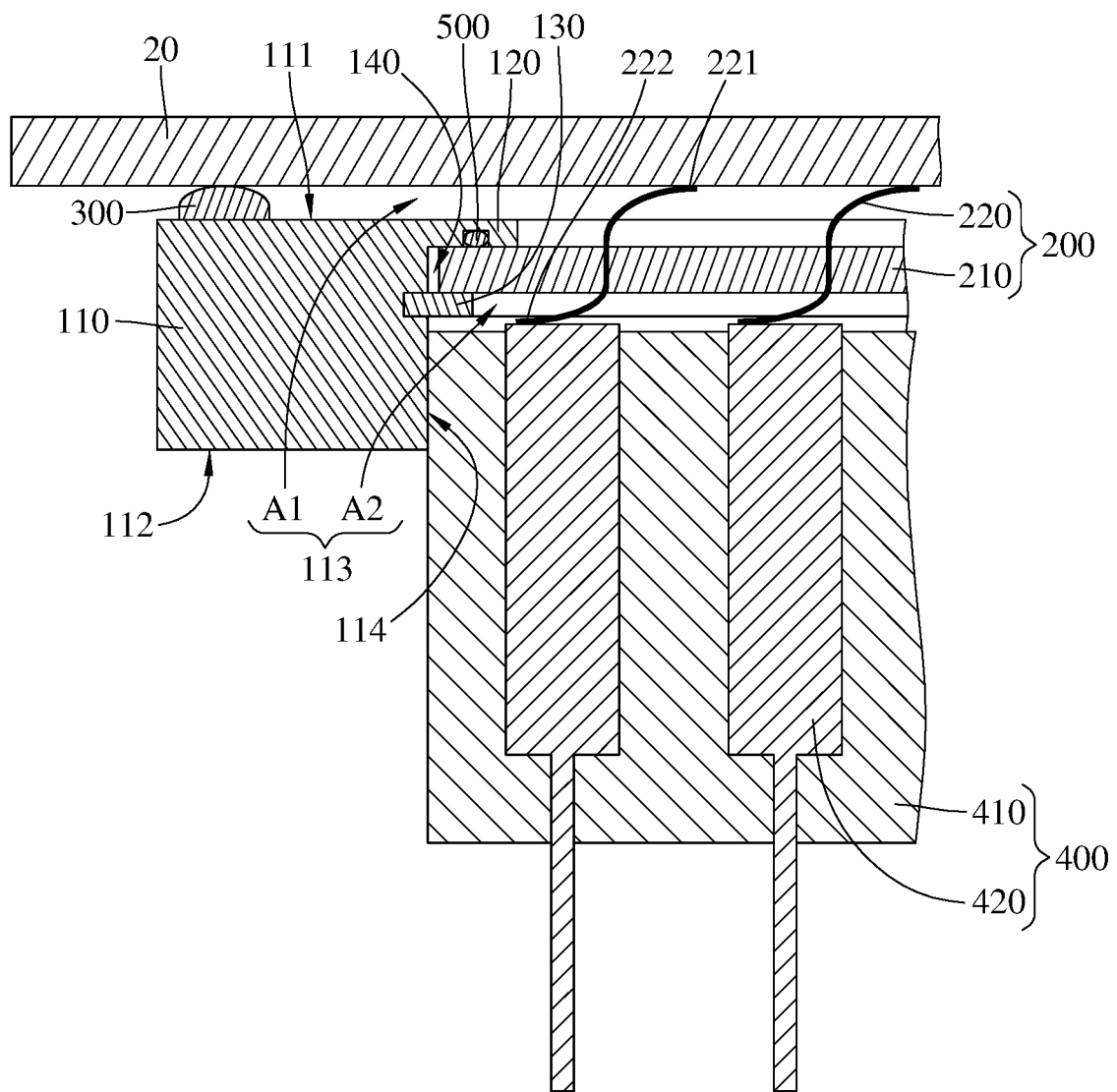
FIG. 3 is a partial enlarged view of the absorption testing apparatus in FIG. 1.

Please refer to FIG. 1 to FIG. 3. FIG. 1 is a cross-sectional view of an absorption testing apparatus in accordance with one embodiment of the disclosure. FIG. 2 is an exploded view of the absorption testing apparatus in FIG. 1. FIG. 3 is a partial enlarged view of the absorption testing apparatus in FIG. 1.

This embodiment provides an absorption testing apparatus 10. The absorption testing apparatus 10 is adaptive to support a carrier board 20. The absorption testing apparatus 10 includes a supporting platform 100, an electrically conductive component 200, a first sealing ring 300 and an electrical probe 400.

The supporting platform 100 includes an annular seat 110 and an annular protrusion 120. The annular seat 110 has a top surface 111, a bottom surface 112, a pathway 113 and an inner surface 114 forming the pathway 113. The pathway 113 penetrates through the top surface 111 and the bottom surface 112. The annular protrusion 120 protrudes from the inner surface 114.

In addition, a surface of the annular protrusion 120 facing away from the electrical probe 400 is coplanar with the top surface 111, but the present disclosure is not limited thereto. In other embodiments, the surface of the annular protrusion 120 facing away from the electrical probe 400 may be non-coplanar with the top surface 111.

The electrically conductive component 200 includes a plate 210 and a plurality of elastic arms 220. The plate 210 is located in the pathway 113 and is embedded in the supporting platform 100. The plate 210 divides the pathway 113 into an absorption area A1 and an accommodating area A2 and isolates them from each other. Thus, air is prevented from flowing from the accommodating area A2 into the absorption area A1. The elastic arms 220 penetrate through the plate 210. Each of the elastic arms 220 has a first end 221 and a second end 222 opposite to each other. The first ends 221 are located in the absorption area A1, and the second ends 222 are located in the accommodating area A2.

In this embodiment, the annular seat 110 has an assembling slot 115. The assembling slot 115 is on the inner surface 114, and is located between the annular protrusion 120 and the bottom surface 112. The supporting platform 100 further includes an assembling block 130, and the assembling block 130 is removably embedded into the assembling slot 115. The annular seat 110, the annular protrusion 120 and the assembling block 130 together form an embed slot 140, and a part of the plate 210 is embedded into the embed slot 140, such that air tightness of the absorption area A1 is improved. However, the present disclosure is not limited thereto. In other embodiments, the plate 210 may be assembled to the supporting platform by other means.

In this embodiment, the absorption testing apparatus 10 further includes a second sealing ring 500. The annular protrusion 120 further has an annular groove 121. The second sealing ring 500 is located in the annular groove 121, and is pressed between the annular protrusion 120 and the plate 210 to improve air tightness of the absorption area A1.

In the aforementioned embodiment, the annular protrusion 120 has an annular groove 121 for positioning the second sealing ring 500, but the present disclosure is not limited thereto. In other embodiments, the annular protrusion may have no annular groove 121.

The first sealing ring 300 is disposed on the top surface 111, and surrounds the absorption area A1. The first sealing ring 300 is adapted to support the carrier board 20, and the first ends 221 of the elastic arms 220 are respectively electrically connected to the circuits of the carrier board 20.

The electrical probe 400 is located in the accommodating area A2 of the pathway 113. The electrical probe 400 includes a body 410 and a plurality of probe heads 420. The body 410 is fixed on the supporting platform 100. The probe heads 420 are respectively electrically connected to the second ends 222 of the elastic arms 220. In this embodiment, the probe heads 420 are solid, which is beneficial for reducing the manufacturing difficulty of the electrical probe 400 and improving the manufacturing quality of the electrical probe 400.

In this embodiment, the absorption area A1 to be vacuumed and the accommodating area A2 for accommodating the electrical probe 400 are isolated from each other by the plate 210. Thus, the vacuuming quality of the absorption area A1 does not affected by the assembling quality of the electrical probe 400 but is more related to the air tightness between the plate 210 and the supporting platform 100. Accordingly, the air tightness tests are no more required, such that the cost and the testing time both are reduced.

Figure 4:
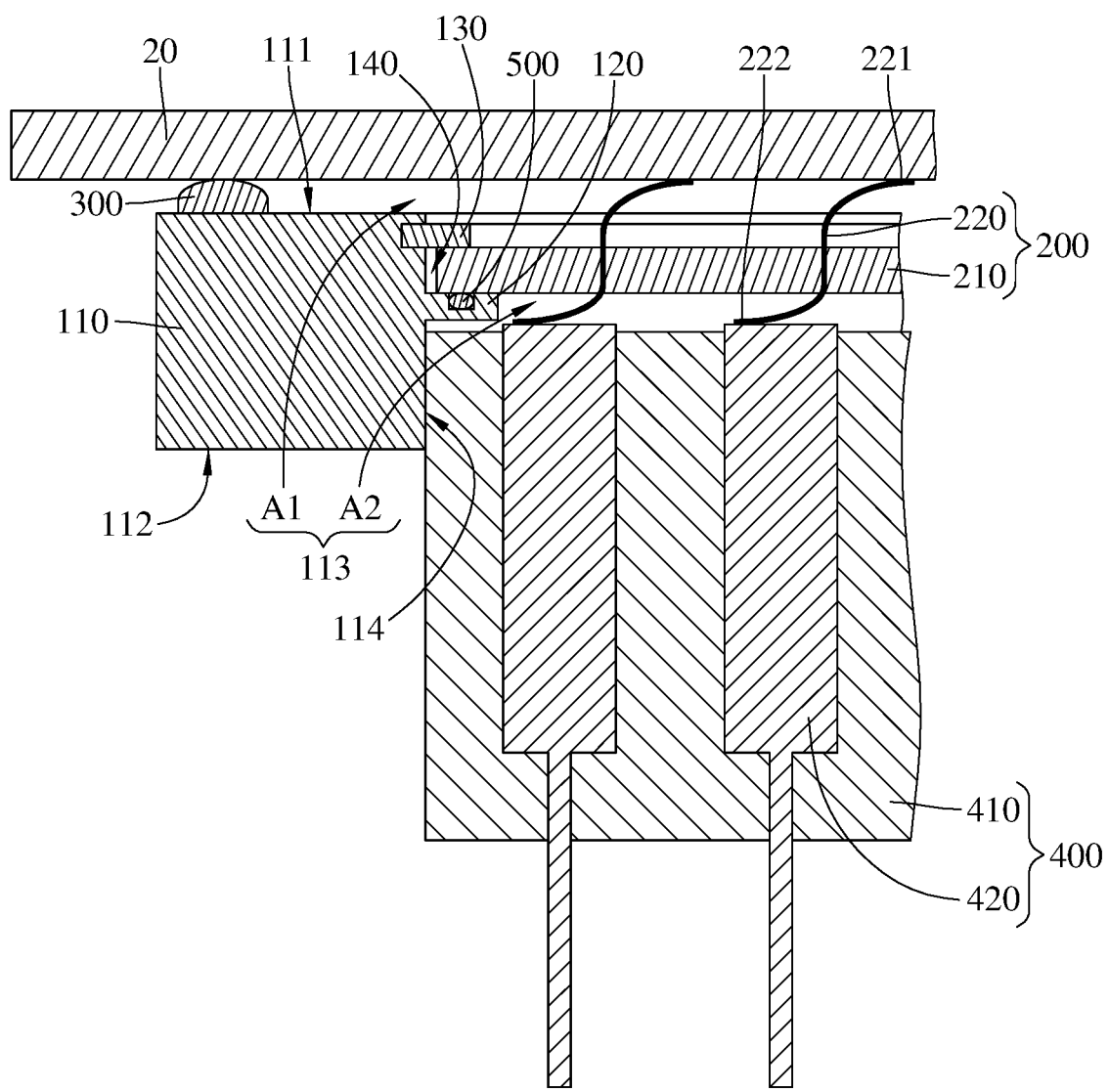
FIG. 4 is a partial enlarged view of an absorption testing apparatus in accordance with another embodiment of the disclosure.

In aforementioned embodiment, the assembling block 130 is located between the annular protrusion 120 and the electrical probe 400, but the present disclosure is not limited thereto. Please refer to FIG. 4. FIG. 4 is a partial enlarged view of an absorption testing apparatus in accordance with another embodiment of the disclosure.

In this embodiment, the annular protrusion 120 is located between the assembling block 130 and the electrical probe 400, which is beneficial for assembling the electrically conductive component 200 from the top of the supporting platform 100.

According to the absorption testing apparatus discussed above, because the plate of the electrically conductive component divides the pathway into the absorption area to be vacuumed and the accommodating area for accommodating the electrical probe, the electrical probe is isolated from the area to be vacuumed, i.e. the absorption area. Therefore, the vacuum quality does not affect by the assembly quality of the seat and the electrical probe. In other words, the electrical probe has no need to undergo the air tightness test, such that the cost and the testing time both are reduced.

The embodiments were chosen and described in order to best explain the principles of the disclosure and its practical applications, to thereby enable others skilled in the art to best utilize the disclosure and various embodiments with various modifications as are suited to the particular use contemplated. It is intended that the scope of the disclosure be defined by the following claims and their equivalents.

What is claimed is:

1. An absorption testing apparatus, adaptive to support a carrier board, comprising:
    a supporting platform, having a top surface, a bottom surface and a pathway, the bottom surface facing away from the top surface, and the pathway penetrating through the top surface to the bottom surface;
    an electrically conductive component, comprising a plate and a plurality of elastic arms, the plate located in the pathway and embedded in the supporting platform to divide the pathway into an absorption area and an accommodating area, the absorption area and the accommodating area isolated by the plate, the plurality of elastic arms penetrating through the plate, wherein the plurality of elastic arms are electrically conductive;
    a first sealing ring, disposed on the top surface of the supporting platform, and surrounding the absorption area, the first sealing ring adaptive to support the carrier board, each of the plurality of elastic arms having one end located in the absorption area in order to electrically connect to the carrier board; and
    an electrical probe, located in the pathway, the electrical probe comprising a body and a plurality of probe heads, the body fixed to the supporting platform, each of the plurality of elastic arms having another end located in the accommodating area in order to electrically connect to the plurality of probe heads;
    wherein the supporting platform comprises an annular seat and an annular protrusion, the annular seat has an inner surface and an assembling slot, the inner surface forms the pathway, the assembling slot is located on the inner surface, the supporting platform further comprises an assembling block, the assembling block is embedded in the assembling slot, and part of the plate of the electrically conductive component is pressed between the annular protrusion and the assembling block.

2. The absorption testing apparatus according to claim 1, further comprising a second sealing ring pressed between the annular protrusion and the plate.

3. The absorption testing apparatus according to claim 2, wherein the annular protrusion further has an annular groove, and the second sealing ring is disposed in the annular groove.

4. The absorption testing apparatus according to claim 1, wherein the assembling block is located between the annular protrusion and the electrical probe.

5. The absorption testing apparatus according to claim 4, wherein a surface of the annular protrusion facing away from the electrical probe is coplanar with the top surface of the supporting platform.

6. The absorption testing apparatus according to claim 1, wherein the annular protrusion is located between the assembling block and the electrical probe.

* * * * *

UNITED STATES PATENT AND TRADEMARK OFFICE
CERTIFICATE OF CORRECTION

PATENT NO.       : 10,527,671 B2  
APPLICATION NO.  : 15/846031  
DATED            : January 7, 2020  
INVENTOR(S)      : Cheng Page 1 of 1

It is certified that error appears in the above-identified patent and that said Letters Patent is hereby corrected as shown below:

On the Title Page

In Column 1, insert Item (30) -- Foreign Application Priority Data, Dec. 28, 2016 (TW) 105143739 --, therefor.

Signed and Sealed this  
Seventeenth Day of November, 2020

Andrei Iancu  
*Director of the United States Patent and Trademark Office*